(12) United States Patent
Ozawa et al.

(10) Patent No.: US 9,983,256 B2
(45) Date of Patent: May 29, 2018

(54) PROBING DEVICE FOR ELECTRONIC DEVICE AND PROBING METHOD

(71) Applicant: TOKYO SEIMITSU CO., LTD, Tokyo (JP)

(72) Inventors: Yuichi Ozawa, Tokyo (JP); Yasuhito Iguchi, Tokyo (JP); Tetsuo Yoshida, Tokyo (JP); Junzo Koshio, Tokyo (JP)

(73) Assignee: Tokyo Seimitsu Co. LTD, Tokyo (JP)

( * ) Notice: Subject to any disclaimer, the term of this patent is extended or adjusted under 35 U.S.C. 154(b) by 0 days. days.

(21) Appl. No.: 14/515,688

(22) Filed: Oct. 16, 2014

(65) Prior Publication Data

US 2015/0109625 A1    Apr. 23, 2015

(30) Foreign Application Priority Data

Oct. 18, 2013   (JP) ................................ 2013-217444

(51) Int. Cl.
*G01R 31/26* (2014.01)
*G01R 31/28* (2006.01)

(52) U.S. Cl.
CPC ..... *G01R 31/2601* (2013.01); *G01R 31/2891* (2013.01); *G01B 2210/56* (2013.01)

(58) Field of Classification Search
CPC .... H01L 41/0805; G01R 3/00; G01R 1/07342
(Continued)

(56) References Cited

U.S. PATENT DOCUMENTS 6,614,250 B1 * 9/2003 Odan ................. G01R 1/07307
                                                            324/755.01
6,787,378 B2 * 9/2004 Ishii et al. .................... 356/625
(Continued)

FOREIGN PATENT DOCUMENTS

| JP | 2006-49599 | * 2/2006 |
|---|---|---|
| JP | 2007-103860 | 4/2007 |
| JP | 2006-149793 | 12/2007 |

OTHER PUBLICATIONS

English translation of Japanese Office Action dispatched Dec. 24, 2014 in corresponding Japanese Application No. 2013-217444.

*Primary Examiner* — Tri Ton
*Assistant Examiner* — Rebecca C Bryant
(74) *Attorney, Agent, or Firm* — Fattibene and Fattibene LLC; Paul A. Fattibene

(57) ABSTRACT

To provide a probing device and a probing method for an electronic device capable of confirming whether or not an electrical inspection has been executed appropriately, with an electrode pad being made in contact with a probe with a predetermined pressure, by utilizing a change in external shapes to be formed on the electrode pad when the probe and the electrode pad are pressed onto each other. The device is provided with a microscope 23 for image-capturing the electrode pad and for outputting the external shape of the electrode pad as image data, and a control unit 27 which stores image data of an external shape of the electrode pad prior to the contact with a probe 102, and compares the image data of the external shape thus stored with image data thereof after the contact obtained from the microscope 23, or compares the registered frame of the electrode pad with the outer periphery of the electrode pad detected at the time of inspecting a needle trace, so that the quality of the contact between the electrode pad and the probe 102 is determined.

7 Claims, 14 Drawing Sheets

(58) Field of Classification Search
USPC ............ 324/750.23, 756.03, 755.01–755.04;
356/237.1–237.6, 366, 326, 516, 610, 51
See application file for complete search history.

(56) References Cited

U.S. PATENT DOCUMENTS

| | | | |
|---|---|---|---|
| 2008/0199980 A1* | 8/2008 | Okayama | G01R 35/00 |
| | | | 438/16 |
| 2012/0043983 A1* | 2/2012 | Sawa | G01R 31/2891 |
| | | | 324/750.19 |

* cited by examiner

PROBING DEVICE FOR ELECTRONIC DEVICE AND PROBING METHOD

BACKGROUND OF THE INVENTION

Field of the Invention

The present invention relates to a probing device for an electronic device and a probing method, and more particularly to a probing device that makes an electrode pad of an electronic device, such as a semiconductor chip (die), MEMS or the like formed on a substrate, such as a semiconductor wafer or the like, in contact with a probe with a predetermined pressure so that an electrical inspection is carried out, and a probing method thereof.

Description of the Related Art

In a semiconductor manufacturing process, various processes are carried out on a thin disc-shaped semiconductor wafer to form a plurality of chips (dies), each having an electronic device. Each chip is inspected for electrical characteristics, and is then individually cut by a dicer and assembled by being secured onto a lead frame or the like.

The above-mentioned inspection for electrical characteristics is executed by utilizing a probe and a tester. As shown in FIG. 3, a wafer W is secured onto a stage 101 that is shiftable in longitudinal directions, and a plurality of probes 102 are installed on a probe card 103 of the wafer W in association with electrode pads (bumps) of an electronic device (not shown).

Upon carrying out electrical inspections, after the position of the probe 102 and the position of the wafer W have been detected, the stage 101 is rotated so as to make the arranging direction of the electrode pads of the chip coincident with the arranging direction of the probes 102. Moreover, after the electrode pads of the chip to be inspected of the wafer W have been moved so as to be located under the probes 102, the stage 101 is raised so that the electrode pads are made in contact with the probes 102.

Each probe 102 exerts a spring characteristic so that by raising the contact point from the tip position of the probe 102, it is made in contact with the electrode pad with a predetermined contact pressure. Moreover, by taking into consideration the inclination between the wafer W and the arrangement surface of the tips of the probes 102 and deviations of the tip positions of the probes 102, in order to positively make the electrode pads and the probes 102 in contact with each other, the electrode pads are raised up to a position higher than the tip positions of the probes 102, that is, the surface of the wafer W is raised by a distance α. This is referred to as "overdrive", and the movement amount by which the surface of the wafer W is further raised from the tip positions of the detected probes 102, that is, the above-mentioned distance α, is referred to as "overdrive amount" (for example, see Patent Document 1).

Moreover, the electrode pad is formed by using soft aluminum, gold or the like with a thickness (height) of 20 to 100 μm relative to the chip plane (surface of the wafer W), and for example, as shown in FIGS. 4 to 6, is formed into various shapes, such as a semi-spherical shape, a trapezoidal shape, a pommel-horse shape (or an oval shape), or the like.

More specifically, FIGS. 4(a), 4(b) and 4(c) show an electrode pad 104 having a semi-spherical shape, and on its side view shown in FIG. 4(a) and its longitudinal side view shown in FIG. 4(b), the shape is indicated as a semi-spherical shape and in its plan view shown in FIG. 4(c), it is indicated as a round shape.

FIGS. 5(a), 5(b) and 5(c) show an electrode pad 204 having a trapezoidal shape, and on its side view shown in FIG. 5(a) and its longitudinal side view shown in FIG. 5(b), the shape is indicated as a trapezoid with its upper surface (top surface) being flat, and in its plan view shown in FIG. 5(c), it is indicated as a rectangular shape.

FIGS. 6(a), 6(b) and 6(c) show an elongated electrode pad 304 having a pommel-horse shape (or an oval shape), and on its side view shown in FIG. 6(a) and its longitudinal side view shown in FIG. 6(b), its upper surface has a peak shape, and in its plan view shown in FIG. 6(c), it is indicated as an oval shape (elongated circular shape).

In the case when, upon carrying out an inspection for electrical characteristics on an electronic device, the electrode pads 104, 204 and 304 are made in contact with the probes 102 in an overdrive state, the tips of the probes 102 are pressed and embedded into the surfaces of the electrode pads 104, 204 and 304, with the result that needle traces 105 are respectively formed on the surfaces of the electrode pads 104, 204 and 304.

Therefore, in general, as a method for confirming whether or not an appropriate inspection has been executed, with the tips of the probes 102 and the surfaces of the electrode pads 104, 204 and 304 being made in contact with each other, determination is made by carrying out an inspection for the presence or absence of the needle traces 105.

Moreover, conventionally, in the needle trace inspection, light is applied onto the surface of each of the electrode pads 104, 204 and 304 through a microscope, and white shinning portions or black non-reflecting portions are determined as the needle traces 105 depending on gradations of black and white.

[Patent Document 1] Japanese Patent No. 4878919

However, as described above, the surfaces of the electrode pads have shapes, such as a semi-spherical protruding shape (see FIG. 4), a plane shape (see FIG. 5), a semi cylindrical protruding shape (see FIG. 6), or the like. In the method for applying light onto the surfaces of the electrode pads 104, 204 and 304 respectively through microscopes so that white shinning portions or black non-reflecting portions are detected as the needle traces 105 depending on gradations of black and white, the presence or absence of the needle traces 105 is determined in the following manner.

(1) As shown in the electrode pad 104 of FIG. 4, in the case when the surface protrudes to form a semi-spherical shape (or a dome shape), an apex 104a of the electrode pad 104 is raised toward the tip of the probe 102 in the order of FIG. 4(d) and FIG. 4(e), with the result that when a pressing force F is applied onto the apex 104a of each of the electrode pads from the probe 102, a needle trace 105 is formed on the apex 104a of the electrode pad 104, as shown in FIG. 4(e). That is, in the case when the surface of the electrode pad 104 protrudes to form the semi-spherical shape, upon application of light through a microscope, the portion of the needle trace 105 looks white as shown in FIG. 4(f). On the other hand, when the apex 104a of the electrode pad 104 deviates from the tip of the probe 102, and when the edge portion 104b of the electrode pad 104 is raised in the order of FIG. 4(g) and FIG. 4(h), a pressing force F is applied onto the edge portion 104b from the probe 102, and as shown in FIG. 4(i), the edge portion 104b of the electrode pad 104 is pressed onto the tip of the probe 102 so that the needle trace 105 is formed on the edge portion 104a. In this case, there is a height difference between the apex 104a and the edge portion 104b of the electrode pad 104 respectively made in contact with the probe 102, with the result that gradations of black and white become unclear since the focal points of the microscopes are different. Moreover, since the surface of the electrode pad from the apex 104a toward the edge portion 104*b* is curved, light from the microscope is irregularly reflected, with the result that the detection of the needle trace 105 becomes difficult. Therefore, in the case when an operator visually carries out a needle-trace inspection, since the focal point needs to be adjusted on each of the electrode pads 104, there is a difference between individual persons in precision. Furthermore, since the number of the electrode pads 104 formed on a chip (electronic device) reaches several thousands to several tens of thousands depending on cases, to carry out an inspection one by one causes a problem of a load imposed on the operator.

(2) As shown in the electrode pad 204 having a trapezoidal shape of FIG. 5, in the case when an apex surface 204*a* forms a flat shape, the flat apex surface 204*a* of the electrode pad 204 is raised toward the tip of the probe 102 in the order of FIG. 5(*d*) and FIG. 5(*e*), with the result that when a pressing force F is applied onto the apex surface 204*a* thereof from the probe 102, a needle trace 105 is formed on the flat apex surface 204*a* of the electrode pad 204, as shown in FIG. 5(*e*). Upon application of light onto the flat apex surface 204*a* of the electrode pad 204 from a microscope, the portion of the needle trace 105 looks black as shown in FIG. 5(*f*), with the other portions of the apex surface 204*a* looking white. On the other hand, when the apex surface 204*a* of the electrode pad 204 deviates from the tip of the probe 102, and when the edge portion 204*b* that is tilted in a manner so as to be lowered outward from the apex surface 204*a* is raised in the order of FIG. 5(*g*) and FIG. 5(*h*), with the result that a pressing force F is applied onto the edge portion 204*b* from the probe 102, as shown in FIG. 5(*i*), the edge portion 204*b* of the electrode pad 204 is pressed onto the tip of the probe 102 so that the needle trace 105 is formed on the edge portion 204*b*. In this case also, there is a height difference between the apex surface 204*a* and the edge portion 204*b* of the electrode pad 204 respectively made in contact with the probe 102, with the result that gradations of black and white become unclear since the focal points of the microscopes are different, to cause a difference between individual persons in precision, making it difficult to detect the needle trace 105 with high precision and raising a problem of a load imposed onto the operator.

(3) As shown in the electrode pad 304 having a pommel-horse shape (oval shape) of FIG. 6, in the case when an upper-side surface forms a peak shape, the apex (ridge line) 304*a* of the electrode pad 304 is raised toward the tip of the probe 102 in the order of FIG. 6(*d*) and FIG. 6(*e*), with the result that when a pressing force F is applied onto the apex 304*a* thereof from the probe 102, a needle trace 105 is formed on the apex 304*a* of the electrode pad 304, as shown in FIG. 6(*e*). Upon application of light onto the apex 304*a* of the electrode pad 304 from a microscope, the portion of the needle trace 105 looks white as shown in FIG. 6(*f*), with the other plane portion looking black. On the other hand, in the case when an edge portion 304*b* of the electrode pad 304, which deviates from the apex 304*a* of the electrode pad 304 relative to the tip of the probe 102 and is also curved to be lowered outward from the apex 304*a*, is raised in the order of FIG. 6(*g*) and FIG. 6(*h*), with the result that a pressing force F is applied onto the edge portion 304*b* from the probe 102, as shown in FIG. 6(*i*), the edge portion 304*b* of the electrode pad 304 is pressed onto the tip of the probe 102 so that a needle trace 105 is formed on the edge portion 304*b*. In this case also, there is a height difference between the apex 304*a* and the edge portion 304*b* of each of the electrode pads 304 respectively made in contact with the probes 102, with the result that gradations of black and white become unclear since the focal points of the microscopes are different, to cause a difference between individual persons in precision. Moreover, since the surface of the electrode pad is curved from the apex 104*a* toward the edge portion 104*b*, light from the microscopes is irregularly reflected, making it difficult to detect the needle trace 105 with high precision and raising a problem of a load imposed onto the operator.

In the case of the electrode pad 104 having a semi-spherical shape shown in FIG. 4, as shown in FIGS. 4(*d*) to 4(*f*), in the case when the apex 104*a* of the electrode pad 104 is pressed onto the tip of the probe 102 so that the needle trace 105 is formed, a plane external shape 104*c* obtained when the electrode pad 104 before an inspection is seen from right above is indicated by FIG. 4(*j*) and a plane external shape 104*c* obtained when the electrode pad 104 after the inspection is seen from right above is indicated by FIG. 4(*k*); therefore, both of these have the same shape before and after the inspection. In contrast, as shown in FIGS. 4(*g*) to 4(*i*), in the case when an edge portion 104*b* of the electrode pad 104 is pressed onto the tip of the probe 102 so that a needle trace 105 is formed on the edge portion 104*b*, a plane external shape 104*c* obtained when the electrode pad 104 after the inspection is seen from right above is indicated by FIG. 4(*l*); thus, a swelled portion protruding outward from the outer periphery, that is, a protruding portion 104*d*, is formed relative to the plane external shape 104*c*, when the electrode pad 104 is viewed from right above before the inspection so that different shapes are formed before and after the inspection. The protruding portion 104*d* is a portion which corresponds to one portion of the electrode pad 104 that is squashed and swelled outward when the edge portion 104*b* of the electrode pad 104 is pressed onto the tip of the probe 102. Therefore, it is also possible to confirm whether or not the electrode pad 104 is made in contact with the probe 102 with a predetermined pressure so that an appropriate inspection is carried out, depending on whether or not one portion of the electrode pad 104 is squashed to be deformed outward so that the protruding portion 104*d* is formed at a portion other than the needle trace 105.

In the case of the electrode pad 204 having a trapezoidal shape of FIG. 5, as shown from FIGS. 5(*d*) to 5(*f*), in the case when the apex surface 204*a* of the electrode pad 204 is pressed onto the tip of the probe 102 so that a needle trace 105 is formed, a plane external shape 204*c* obtained when the electrode pad 204 before an inspection is seen from right above is indicated by FIG. 5(*j*) and a plane external shape 204*c* obtained when the electrode pad 204 after the inspection is seen from right above is indicated by FIG. 5(*k*); therefore, both of these have the same shape before and after the inspection. In contrast, as shown in FIGS. 5(*g*) to 5(*i*), in the case when an edge portion 204*b* of the electrode pad 204 is pressed onto the tip of the probe 102 so that a needle trace 105 is formed on the edge portion 204*b*, a plane external shape 204*c* obtained when the electrode pad 204 after the inspection is seen from right above is indicated by FIG. 5(*l*); thus, a swelled portion protruding outward from the outer periphery, that is, a protruding portion 204*d*, is formed relative to the plane external shape 204*c*, when the electrode pad 204 before an inspection is viewed from right above so that different shapes are formed before and after the inspection. The protruding portion 204*d* is a portion which corresponds to one portion of the electrode pad 204 that is squashed and swelled outward when the edge portion 204*b* of the electrode pad 204 is pressed onto the tip of the probe 102. Therefore, in this case also, it is also possible to confirm whether or not the electrode pad 204 is made in contact with the probe 102 with a predetermined pressure so that an appropriate inspection is carried out, depending on whether or not one portion of the electrode pad 204 is squashed to be deformed outward so that the protruding portion 204d is formed at a portion other than the needle trace 105.

In the case of the electrode pad 304 having a pommel-horse shape (or an elongated circular shape) of FIG. 6, as shown in FIGS. 6(*d*) to 6(*f*), in the case when the apex 304a of the electrode pad 304 is pressed onto the tip of the probe 102 so that a needle trace 105 is formed, a plane external shape 304c obtained when the electrode pad 304 before the inspection is viewed from right above is indicated by FIG. 6(*j*) and a plane external shape 304c obtained when the electrode pad 304 after the inspection is viewed from right above is indicated by FIG. 6(*k*); therefore, both of these have the same shape before and after the inspection. In contrast, as shown in FIGS. 6(*g*) to 6(*i*), in the case when the edge portion 304b of the electrode pad 304 is pressed onto the tip of the probe 102 so that the needle trace 105 is formed on the edge portion 304b, a plane external shape 304c obtained when the electrode pad 304 after the inspection is viewed from right above is indicated by FIG. 6(*l*); thus, a swelled portion protruding outward from the outer periphery, that is, a protruding portion 304d, is formed relative to the plane external shape 304c, when the electrode pad 304 is viewed from right above so that different shapes are formed before and after the inspection. The protruding portion 304d is a portion which corresponds to one portion of the electrode pad 304 that is squashed and swelled outward when the edge portion 304b of the electrode pad 304 is pressed onto the tip of the probe 102. Therefore, in this case also, it is also possible to confirm whether or not the electrode pad 304 is made in contact with the probe 102 with a predetermined pressure so that an appropriate inspection is carried out, depending on whether or not one portion of the electrode pad 304 is squashed to be deformed outward so that the protruding portion 304d is formed at a portion other than the needle trace 105.

Therefore, technical problems are raised when an attempt is made to provide a probing device and a probing method for an electronic device which make it possible to recognize whether or not an electrical inspection has been appropriately carried out, with the electrode pad being made in contact with a probe with a predetermined pressure, by utilizing a change in an external shape formed on the electrode pad when the probe and the electrode pad are pressed onto each other, and the object of the present invention is to solve these problems.

SUMMARY OF THE INVENTION

The present invention has been devised to achieve the above-mentioned object, and an invention in accordance an embodiment provides a probing device, which carries out an electrical inspection by making an electrode pad of an electronic device on a substrate in contact with a probe with a predetermined pressure, and is provided with a microscope that captures an image of the electrode pad and outputs an external shape of the electrode pad as image data, and a control unit that stores image data of an external shape of the electrode pad prior to the contact with the probe, and compares the image data of the external shape thus stored or the external shape with image data of the external shape after the contact obtained from the microscope, so that the quality of the contact between the electrode pad and the probe is determined.

In accordance with this configuration, in an inspection for an electrical characteristic, the external shape of an electrode pad after the inspection in which a pressing operation between a probe and an electrode pad has been carried out is image-captured by a microscope, and the image data of the electrode pad after the inspection and image data of the electrode pad before the inspection are compared with each other so that a detection is made as to whether or not there is any difference in the external shapes corresponding to a protruding portion or the like that does not exist in the electrode pad image before the inspection, in the electrode pad image after the inspection. Then, if there is any difference in the external shapes, it is determined that the electrode pad and the probe are made in contact with each other with a predetermined pressure so that the inspection has been appropriately carried out, while if there is no difference, it is determined that the electrode pad and the probe are not made in contact with each other with a predetermined pressure, with the result that the inspection has not been appropriately carried out. Therefore, by carrying out the determination based upon comparisons between the electrode pad external shapes by utilizing the protruding portion or the like in combination with the determination that is carried out by applying light thereon from a microscope so that the needle trace is detected based upon black and white gradations, it becomes possible to easily carry out an accurate determination even in the case when there is a height difference between the apex and the edge portion of the electrode pad made in contact with the probe to make gradations between black and white unclear.

An invention in accordance with another embodiment, provides a probing device further having a storage device that preliminarily registers a standard contour of the electrode pad, and a control unit that compares the contour registered in the storage unit with the contour of the electrode pad that is a subject for the needle trace inspection, so that the quality of the contact between the electrode pad and the probe is determined.

In accordance with this configuration, even in the case when there is no image of the electrode pad before an inspection, the outer periphery of such an electrode pad (such an electrode pad as to be deformed from its original shape) as to have a needle trace on an edge portion is detected based upon the size and shape of any one of the stored electrode pads, and by collating this with registered frames so as to detect a protruding portion, the determination can be easily made even in the case when the probe is made in contact with the vicinity of an edge portion of the electrode pad, with the result that no needle trace is visible under microscope. Moreover, based upon the contour of the detected pad and the pad shape preliminarily stored, a strain in the pad shape can be determined so that the quality of the contact can be determined by regarding the strain as a needle trace.

An invention in accordance with another embodiment, provides a probing device in which the control unit mutually compares image data of external shapes of the electrode pads obtained by allowing the microscope to image-capture the electrode pad from virtually right above, so that a difference in the shapes is determined based upon the presence or absence of a protruding portion of the electrode pad after the contact.

In accordance with this configuration, since the difference in the external shapes is determined based upon the presence or absence of a protruding portion of the electrode pad obtained by image-capturing the external shapes of the electrode pad from right above, it is possible to simplify the determination processing operation, and consequently to realize the operation at low costs.

An invention in accordance with another embodiment provides a probing device in which the control unit applies light toward the surface of the electrode pad from the microscope and detects a needle trace by binarizing light derived from the reflected light from the surface of the electrode pad, and based upon the needle trace and the presence or absence of the protruding portion of the electrode, the possibility of the contact is determined.

In accordance with this configuration, since the control unit recognizes whether or not the electrode pad and the probe are made in contact with each other with a predetermined pressure so that an appropriate inspection is carried out, based upon both of the needle trace obtained by the microscope and the presence or absence of the protruding portion of the electrode pad, it is possible to improve the detection precision.

An invention in accordance with another embodiment, which relates to a probing device that makes an electrode pad of an electronic device on a substrate in contact with a probe with a predetermined pressure so as to carry out an electrical inspection, is provided with a control unit that includes a process for preliminarily specifying the size and the shape of each of the electrode pads, and compares the outer periphery contour of the electrode pad after the probing with the shape specified by the process so that the quality of the contact between the electrode pad and the probe is determined.

In accordance with this configuration, since the size and the shape are preliminarily specified for each of electrode pads, it is possible to easily deal with various electronic devices.

An invention in accordance with another embodiment, which relates to a probing method that makes an electrode pad of an electronic device on a substrate in contact with a probe with a predetermined pressure so as to carry out an electrical inspection, is provided with a process for comparing image data of the external shape of the electrode pad before contact with the probe and image data of the external shape of the electrode pad after the contact with the probe so that the quality of the contact between the electrode pad and the probe is determined.

In accordance with this method, in an inspection for an electrical characteristic, the external shape of an electrode pad after the inspection in which a pressing operation between a probe and an electrode pad has been carried out is image-captured by a microscope, and the image data of the electrode pad after the inspection and image data of the electrode pad before the inspection are compared with each other so that a detection is made as to whether or not there is any difference in the external shapes corresponding to a protruding portion or the like that does not exist in the electrode pad image before the inspection, in the electrode pad image after the inspection. Then, if there is any difference in the external shapes, it is determined that the electrode pad and the probe are made in contact with each other with a predetermined pressure so that the inspection has been appropriately carried out, while if there is no difference, it is determined that the electrode pad and the probe are not made in contact with each other, with the result that the inspection has not been appropriately carried out. Therefore, by carrying out the determination based upon comparisons between the electrode pad external shapes by utilizing the protruding portion or the like in combination with the determination carried out by applying light thereon from a microscope so that the needle trace is detected based upon black and white gradations, it becomes possible to easily carry out an accurate determination even in the case when there is a height difference between the apex and the edge portion of the electrode pad made in contact with the probe to make gradations between black and white unclear.

An invention in accordance with another embodiment, provides a probing method in which light is applied toward the surface of the electrode pad from the microscope and the needle trace is detected by binarizing light derived from the reflected light from the surface of the electrode pad, and based upon the detected needle trace of the probe and a difference in the external shapes of the mutual electrode pads, the quality of the contact is determined.

In accordance with this method, based upon the needle trace obtained by applying light to the surface of the electrode pad and detecting light derived from the reflected light from the surface of the electrode pad and a difference between the external shapes obtained from an image acquired by image-capturing the electrode pad, the contact state of the probe and the electrode pad can be determined easily and precisely.

In accordance with the present invention, in an inspection for an electrical characteristic, the external shape of an electrode pad after the inspection in which a pressing operation between a probe and an electrode pad has been carried out is image-captured by a microscope, and the image data of the electrode pad after the inspection and image data of the electrode pad before the inspection are compared with each other so that a detection is made as to whether or not there is any difference in the external shapes corresponding to a protruding portion or the like that does not exist in the electrode pad image before the inspection, in the electrode pad image after the inspection. Moreover, in the case when there is no image of the electrode pad before the inspection, the outer periphery of a standard electrode pad (electrode pad having a needle trace at a correct portion) is surrounded by a frame, and registered. By detecting a portion or the like protruding from the registered frame by making collation with such an electrode pad as to have a needle trace on an edge portion (electrode pad that is deformed from its original shape), it is possible to determine whether or not an inspection is appropriately carried out.

By using the above-mentioned processes, the inspection can be automatically carried out so that it is possible to reduce the load imposed on the operator. Moreover, in combination with the method in which the external shape before the inspection and the external shape after the inspection are compared with each other so that the determination is made, by carrying out the conventionally adopted method in which light is applied from a microscope so as to carry out the determination by detecting the needle trace based upon gradations of black and white, it becomes possible to easily carry out an accurate determination even in the case when there is a height difference between the apex and the edge portion of the electrode pad made in contact with the probe to cause gradations between black and white to become unclear so that the precision can be further improved and the operation can be further simplified, thereby making it possible to reduce the load imposed on the operator.

BRIEF DESCRIPTION OF THE DRAWINGS

FIG. 4(b) that is a longitudinal side view of the electrode pad before being made in contact with the probe; FIG. 4(c) that is a view showing one example of electrode pad image data obtained by a microscope before being made in contact with the probe; FIG. 4(d) that is a side view of the electrode pad showing a state in which the center of the electrode pad is in the middle of being pressed onto the probe; FIG. 4(e) that is a longitudinal side view of the electrode pad showing a state after the apex has been pressed onto the probe; FIG. 4(f) that is a view showing one example of electrode pad image data obtained by a microscope after the apex has been pressed onto the probe; FIG. 4(g) that is a side view of the electrode pad showing a state in which an edge portion of the electrode pad is in the middle of being pressed onto the probe; FIG. 4(h) that is a longitudinal side view of the electrode pad after the edge portion of the electrode pad has been pressed onto the probe; FIG. 4(i) that is a view showing one example of electrode pad image data obtained by a microscope after the center portion of the electrode pad has been pressed onto the probe; FIG. 4(j) that is a view showing one example of electrode pad image data obtained by the microscope before being made in contact with the probe; FIG. 4(k) that is a view showing one example of electrode pad image data obtained by the microscope after the center portion of the electrode pad has been pressed onto the probe; and FIG. 4(l) that is a view showing one example of electrode pad image data obtained by the microscope after the edge portion of the electrode pad has been pressed onto the probe.

FIG. 5(b) that is a longitudinal side view of the electrode pad before being made in contact with the probe; FIG. 5(c) that is a view showing one example of electrode pad image data obtained by a microscope before being made in contact with the probe; FIG. 5(d) that is a side view of the electrode pad showing a state in which the flat apex surface of the electrode pad is in the middle of being pressed onto the probe; FIG. 5(e) that is a longitudinal side view of the electrode pad showing a state after the flat apex surface of the electrode pad has been pressed onto the probe; FIG. 5(f) that is a view showing one example of electrode pad image data obtained by a microscope after the flat apex surface of the electrode pad has been pressed onto the probe; FIG. 5(g) that is a side view of the electrode pad showing a state in which an edge portion of the electrode pad is in the middle of being pressed onto the probe; FIG. 5(h) that is a longitudinal side view of the electrode pad after the edge portion of the electrode pad has been pressed onto the probe; FIG. 5(i) that is a view showing one example of electrode pad image data obtained by a microscope after the center portion of the electrode pad has been pressed onto the probe; FIG. 5(j) that is a view showing one example of electrode pad image data obtained by the microscope before being made in contact with the probe; FIG. 5(k) that is a view showing one example of electrode pad image data obtained by the microscope after the flat apex surface of the electrode pad has been pressed onto the probe; and FIG. 5(l) that is a view showing one example of electrode pad image data obtained by the microscope after the edge portion of the electrode pad has been pressed onto the probe.

FIG. 6(b) that is a longitudinal side view of the electrode pad before being made in contact with the probe; FIG. 6(c) that is a view showing one example of image data obtained by a microscope before being made in contact with the probe; FIG. 6(d) that is a side view of the electrode pad showing a state in which the apex of the electrode pad is in the middle of being pressed onto the probe; FIG. 6(e) that is a longitudinal side view of the electrode pad showing a state after the apex has been pressed onto the probe; FIG. 6(f) that is a view showing one example of electrode pad image data obtained by a microscope after the apex has been pressed onto the probe; FIG. 6(g) that is a side view of the electrode pad showing a state in which an edge portion of the electrode pad is in the middle of being pressed onto the probe; FIG. 6(h) that is a longitudinal side view of the electrode pad after the edge portion of the electrode pad has been pressed onto the probe; FIG. 6(i) that is a view showing one example of electrode pad image data obtained by a microscope after the apex of the electrode pad has been pressed onto the probe; FIG. 6(j) that is a view showing one example of electrode pad image data obtained by the microscope before being made in contact with the probe; FIG. 6(k) that is a view showing one example of electrode pad image data obtained by the microscope after the apex of the electrode pad has been pressed onto the probe; and FIG. 6(l) that is a view showing one example of electrode pad image data obtained by the microscope after the edge portion of the electrode pad has been pressed onto the probe.

FIG. 7(b) that explains a contour of the electrode pad detected after the inspection.

FIG. 10(b) that explains a contour of the electrode pad detected after the inspection.

FIG. 12(b) that explains a contour of the electrode pad detected after the inspection; and FIG. 12(c) that explains how to express the shape of the electrode pad.

DETAILED DESCRIPTION OF THE PREFERRED EMBODIMENTS

In order to achieve an object for providing a probing device and a probing method for an electronic device that make it possible to recognize whether or not an electrical inspection is appropriately carried out, with the electrode pad being made in contact with the probe with a predetermined pressure, by utilizing a change in an external shape formed on an electrode pad when a probe and the electrode pad are pressed onto each other, the present invention provides processes which compare image data of an external shape of the electrode pad before the contact with the probe with image data of the external shape of the electrode pad after the contact with the probe, and determine the quality of the contact between the electrode pad and the probe, thereby making it possible to achieve the above-mentioned object.

Referring to Figs., the following description will discuss preferred embodiments of one example of a probing device and a probing method in accordance of the present invention.

Embodiments

Figure 1:
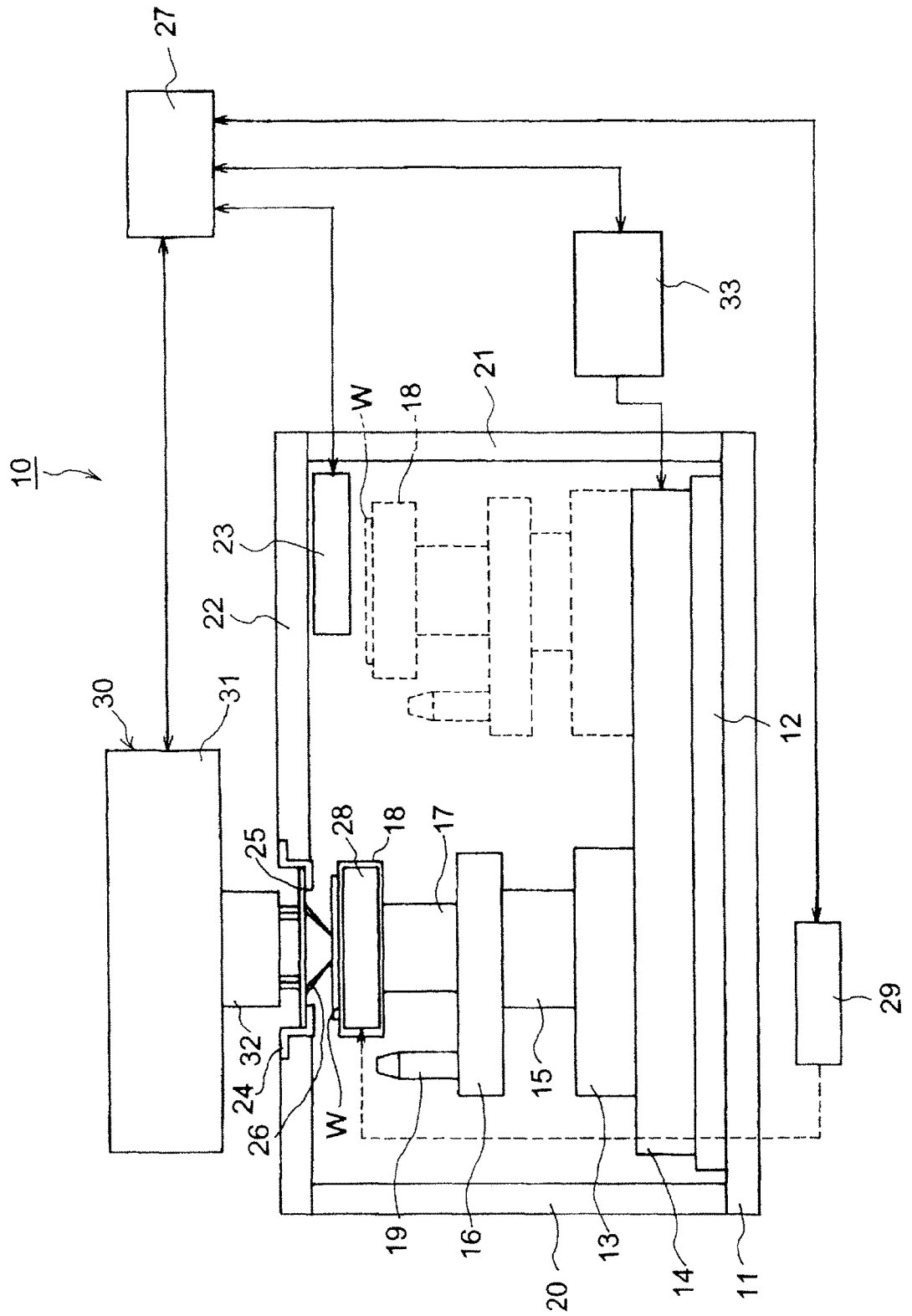
FIG. 1 is a schematic block diagram showing a system for allowing a prober to inspect a chip on a wafer.

FIG. 1 is a schematic block diagram showing a system for inspecting a chip on a wafer to which the probing device of the present invention is applied. In this Fig., a prober device 10 is constituted by a base mount 11, a movement base 12 placed thereon, a Y-axis movement unit 13, an X-axis movement unit 14, a Z-axis movement unit 15, a Z-axis movement base 16, a θ rotation unit 17, a stage 18, a needle-position adjusting camera 19 for use in detecting the position of a probe, support pillars 20 and 21, a head stage 22, alignment cameras 23 attached to the support pillars, not shown, a card holder 24 formed on the head stage 22, a probe card 25 to be attached to the card holder 24, a control unit 27 and the like.

On the probe card 25, a probe 26 including a cantilever, spring pins and the like, which is disposed in association with an electrode pad layout of a device to be inspected, is installed. The probe card 25 is exchanged in accordance with devices to be inspected.

The movement base 12, the Y-axis movement unit 13, the X-axis movement unit 14, the Z-axis movement unit 15, the Z-axis movement base 16 and the θ rotation unit 17 form a movement-rotation mechanism that rotates the stage 18 in the three-axial directions as well as around the Z-axis, which is controlled by the control unit 27. Since the movement-rotation mechanism has been widely known, the description thereof will be omitted in this case.

The above-mentioned probe 26 has a spring characteristic, and in the case when upon carrying out an inspection for an electrical characteristic, an electrode pad is made in contact with the probe 26 in an overdrive state, the tip of the probe 26 is embedded into the surface of the electrode pad so that a needle trace is formed on the surface of each of the electrode pads.

Inside the stage 18, a heater-cooling liquid path 28 for keeping the stage 18 at a high temperature or a low temperature is formed, and by a temperature control unit 29 controlled by the control unit 27, power to be supplied to the heater and the temperature of the cooling liquid to be circulated inside the heater-cooling liquid path 28 are adjusted. Thus, the stage 18 can be adjusted to a desired temperature between high temperature and low temperature, and in accordance with this, the inspection is carried out while a wafer W held on the stage 18 is kept at a predetermined temperature.

The above-mentioned tester 30 is provided with a tester main body 31 and a contact ring 32 formed on the tester main body 31. The probe card 25 is provided with terminals to be connected to the respective probes 26, and the contact ring 32 has spring probes that are arranged so as to be made in contact with the terminals. The tester main body 31 is supported onto the prober 10 by a support mechanism, not shown.

The above-mentioned alignment camera 23, which is a so-called electron microscope, is capable of applying light onto the external shape of an electrode pad on a wafer W positioned below the alignment camera 23 and a needle trace on the electrode pad formed when the probe 26 and the electrode pad are made in contact with each other, and of binarizing light reflected from the surface of the electrode pad so as to output the respective pieces of information to the control unit 27 as image data.

The above-mentioned control unit 27, which controls the entire system in accordance with a predetermined sequence of processes, is constituted by a microcomputer mainly composed of a CPU (central processing unit) for carrying out various operations and the like, a memory having a ROM for storing programs used in the CPU and a RAM for temporarily storing data, and interfaces and the like for exchanging various pieces of data.

In the case when an inspection for semiconductor chips (electronic devices) on the wafer W is carried out, the Z-axis movement base 16 is moved so as to place the needle-position adjusting camera 19 below the probe 26 by the control of the control unit 27 so that the tip position of the probe 26 is detected by the needle-position adjusting camera 19. The detection of the tip position of the probe 26 needs to be always carried out upon exchanging probe cards, and even in the case when no probe cards 25 are exchanged, the detection is carried out on demand each time a predetermined number of chips have been measured.

Next, in a state where the wafer W to be inspected is held on the stage 18, the Z-axis movement base 16 is moved so as to place the wafer W below the alignment camera 23 so that the position of the electrode pad of the electronic device on the wafer W is detected. Additionally, in this case, it is not necessary to detect the positions of all the electrode pads on one chip, and the positions of some of the electrode pads are detected. The relative position between the needle-position adjusting camera 19 and the alignment camera 23 is preliminarily measured by detecting the tip position of the probe 26 by the needle-position adjustment camera 19, as well as by detecting a needle trace formed when the corresponding probe 26 is made in contact with the electrode pad and the external shape of the electrode pad by the use of the alignment camera 23, and the resulting position is stored in a memory of the control unit 27.

Figure 2:
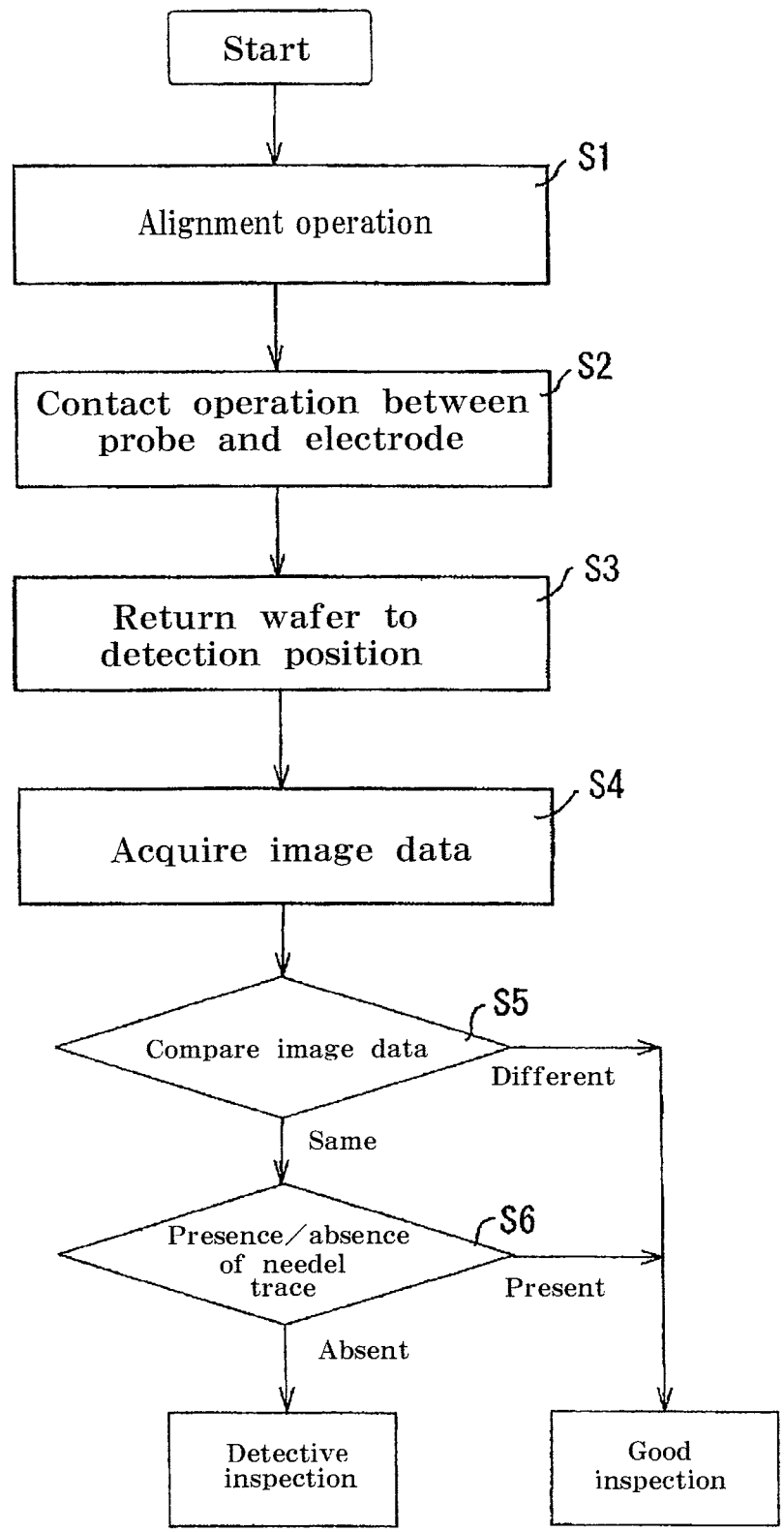
FIG. 2 is a flow chart showing one example of basic operations in a probing device and a probing method of the present invention.
Figure 3:
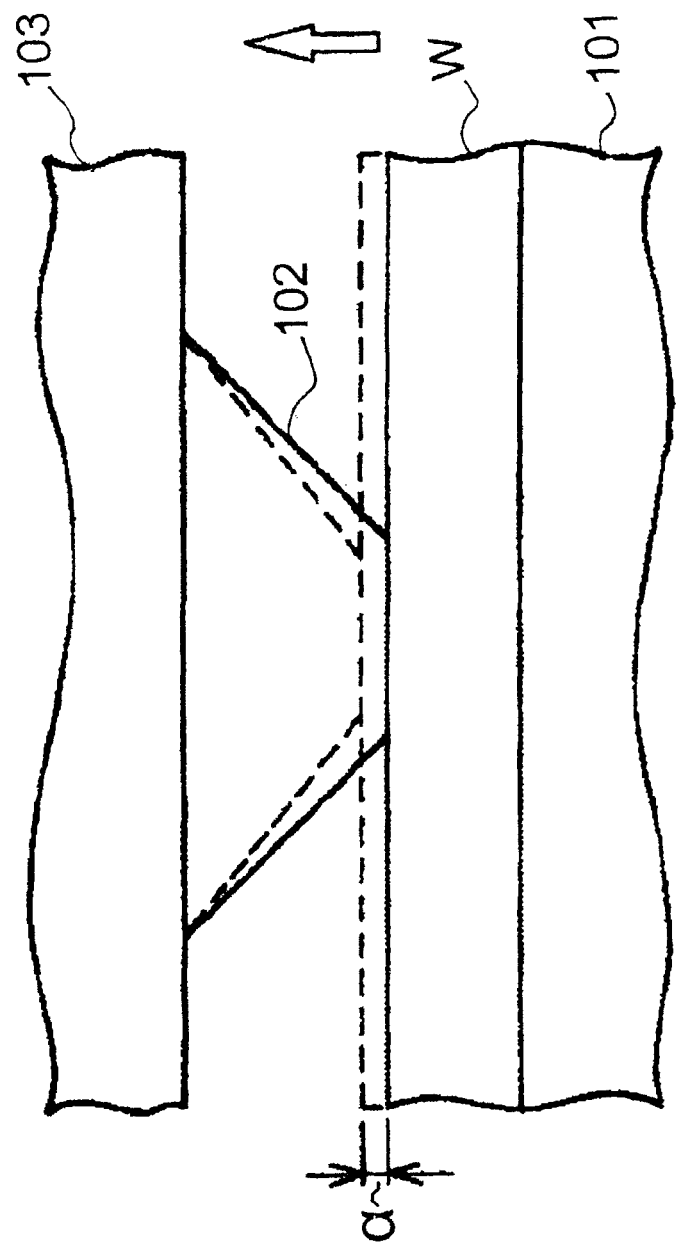
FIG. 3 is a view that explains operations in which electrode pads are made in contact with a probe.

FIG. 2 is a flow chart showing one example of basic operations in the probing device and probing method of the present invention. As shown in FIG. 2, in accordance with the probing device of the present invention, an alignment operation is carried out in step S1, and in step S2, based upon the results of the alignment operation, an operation for allowing the probe 26 to be made in contact with the electrode pad is carried out.

Next, in step S3, the wafer W is returned to the position below the alignment camera 23, that is, to the detection position. Successively, in step S4, the external shape of the electrode pad on which the contact operation has been finished is detected by the alignment camera 23 so that image data of the external shape of the electrode pad is sent to the control unit 27 and by applying light onto the surface of the electrode pad from the alignment camera 23, image data including a needle trace corresponding to a white or black shining portion derived from gradations of black and white are binarized and sent to the control unit 27.

Next, in step S5, the external shape of the electrode pad on which the contact operation has been finished is compared with the external shape of the electrode pad that has been preliminarily measured and stored in the memory of the control unit 27, and it is determined whether or not there is any difference in the external shapes. In the case when there is a difference in the external shapes, it is determined that the electrode pad has been made in contact with the probe 26.

In contrast, in the case when it is determined that there is no difference in the external shapes, in step S6, a determination is made as to whether or not there is a needle trace on image data, and in the case when there is a needle trace, it is determined that the electrode pad has been made in contact with the probe 26 with a predetermined pressure so that "inspection result is good". However, in the case of no needle trace, it is determined that "inspection result is not good (error)".

Therefore, in the inspection by the probing device in accordance with the present invention, the external shape of the electrode pad after the inspection has been carried out by pressing the probe 26 and the electrode pad onto each other is image-captured by the alignment camera 23, that is, the microscope, and the image data of the electrode pad after the inspection is compared with image data of the electrode pad before the inspection. Then, in the case when the two external shapes are different from each other, it is determined that the inspection is appropriately carried out, with the electrode pad and the probe being made in contact with each other with a predetermined pressure, and in the case when the external shapes are not different from each other, it is determined that the inspection is not carried out appropriately, with the electrode pad and the probe being not made in contact with each other.

Moreover, with respect to the electrode pad on which it is determined that the inspection has not been carried out appropriately, the electrode pad is further determined as to whether or not there is a needle trace thereon, and in the case when there is a needle trace, it is determined that the inspection has been carried out appropriately, while in the case when no needle trace exists, it is determined that the inspection has not been appropriately carried out; thus, by using two processes in combination, the determination is carried out with high precision.

By carrying out the inspection by using the two determination processes in combination, it becomes possible to easily carry out an accurate determination even in the conventional case where there is a height difference between the apex and the edge portion of the electrode pad made in contact with the probe to cause gradations between black and white to become unclear. Moreover, the inspection can be automatically carried out so that it is also possible to reduce the load imposed on the operator.

Figure 4:
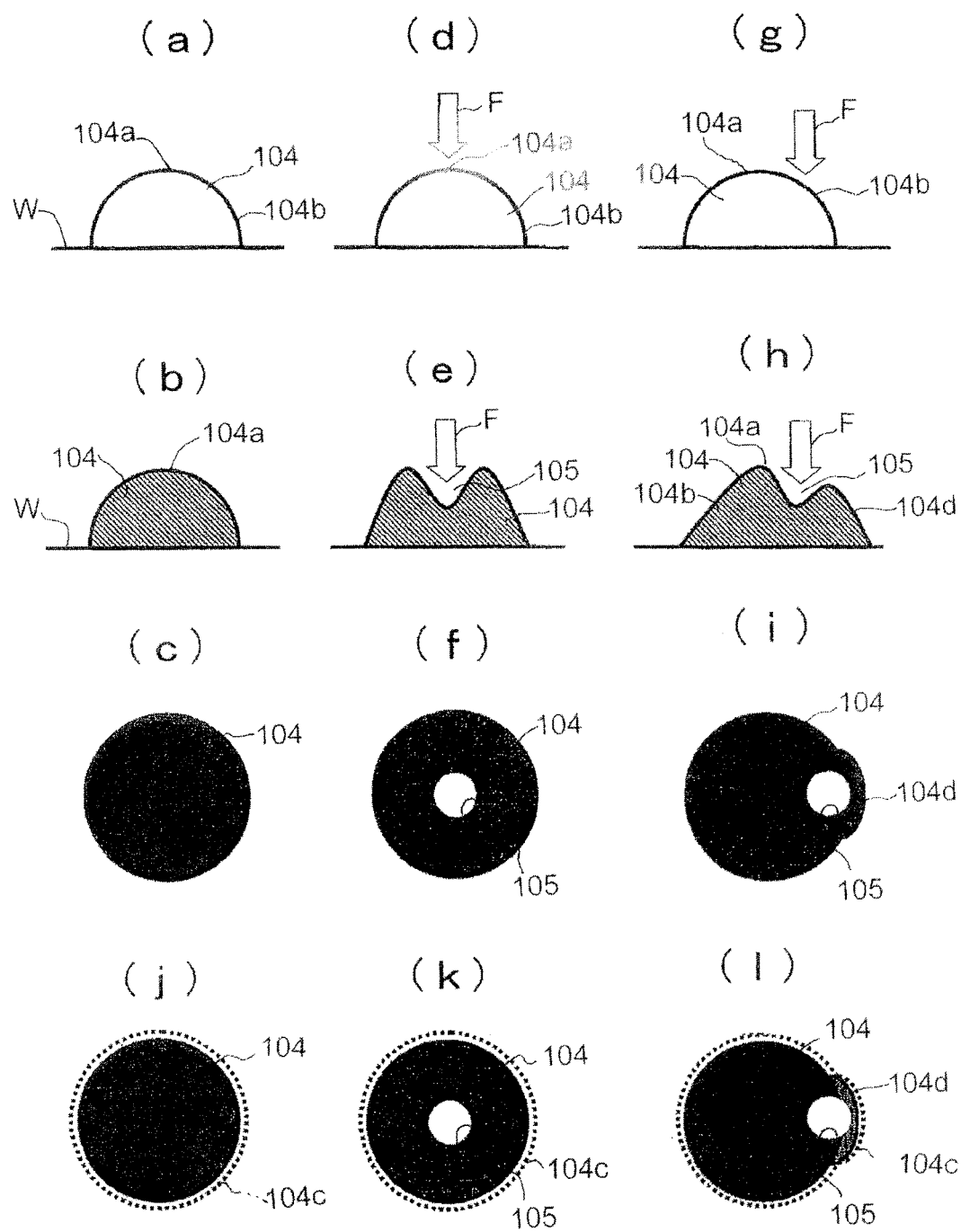
FIG. 4, which show one example of electrode pads, each having a semi-spherical shape, include FIG. 4(a) that is a side view showing a shape of the electrode pad before being made in contact with the probe.
Figure 5:
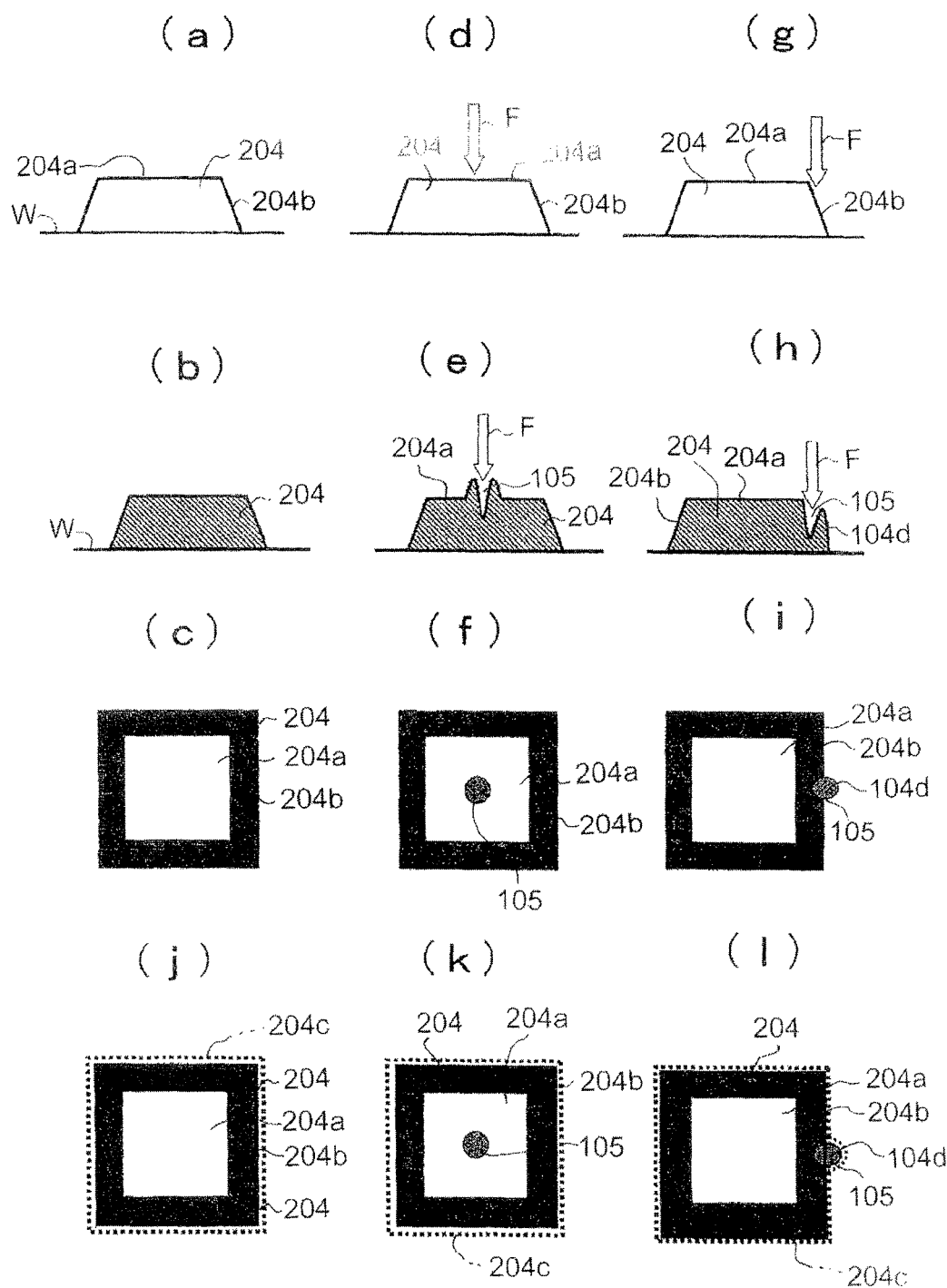
FIG. 5, which show one example of electrode pads having a trapezoidal shape, include FIG. 5(a) that is a side view showing a shape of the electrode pad before being made in contact with the probe.
Figure 6:
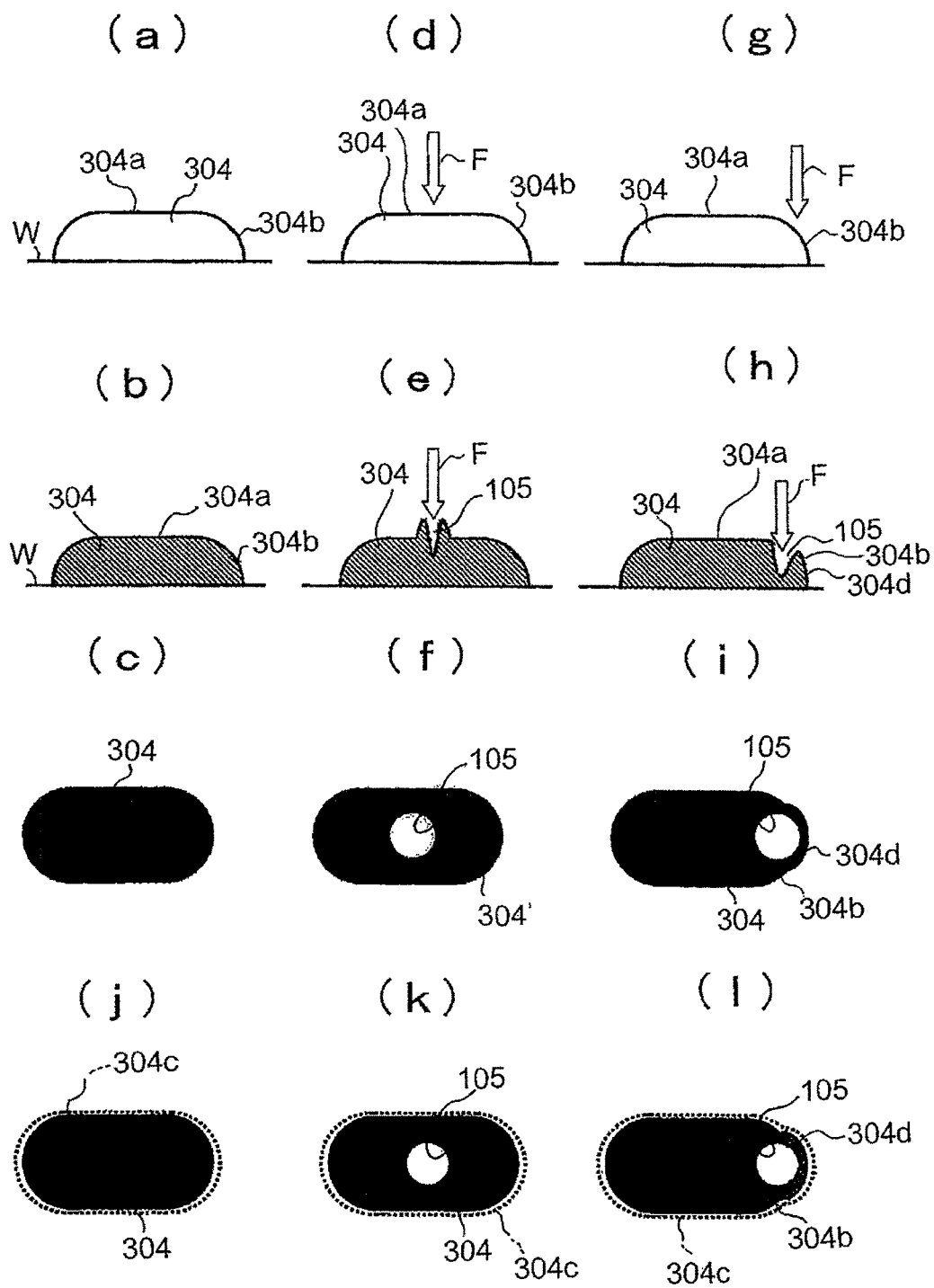
FIG. 6, which show one example of electrode pads having a pommel-horse shape, include FIG. 6(a) that is a side view showing a shape of the electrode pad before being made in contact with the probe.

Additionally, as comparative examples and determination criteria of the external shape, by exemplifying cases of electrode pads 104, 105 and 106 as shown in FIGS. 4 to 6, determinations are made, and the results are shown below.

In the case of the electrode pad 104 having a semispherical shape shown in FIG. 4, an external plane shape 104c obtained by viewing the electrode pad 104 before the inspection from right above is indicated by FIG. 4(j), and an external plane shape 104c obtained by viewing the electrode pad 104 after the inspection from right above is indicated by FIG. 4(k) and FIG. 4(l). Therefore, in the comparison of the above-mentioned step S5, when a protruding portion 104d exists on an edge portion 104b, the external shapes are determined as being different and as "good in the inspection". Moreover, even in the case when the external shapes are determined as the same and as "defective in the inspection", if a needle trace 105 shown in FIG. 4(k) is detected in step S6, it is determined as "good in the inspection", while if no needle trace 105 is detected, it is determined as "defective in the inspection".

In the case of the electrode pad 204 having a trapezoidal shape shown in FIG. 5, an external plane shape 204c obtained by viewing the electrode pad 204 before the inspection from right above is indicated by FIG. 5(j), and an external plane shape 204c obtained by viewing the electrode pad 204 after the inspection from right above is indicated by FIG. 5(k) and FIG. 5(l). Therefore, in the comparison of the above-mentioned step S5, when a protruding portion 204d exists on an edge portion 204b, the external shapes are determined as being different and as "good in the inspection". Moreover, even in the case when the external shapes are determined as the same and as "defective in the inspection", if a needle trace 105 shown in FIG. 5(k) is detected in step S6, it is determined as "good in the inspection", while if no needle trace 105 is detected, it is determined as "defective in the inspection".

In the case of the electrode pad 304 having a pommelhorse shape (an elongated circular shape) shown in FIG. 6, an external plane shape 304c obtained by viewing the electrode pad 304 before the inspection from right above is indicated by FIG. 6(j), and an external plane shape 304c obtained by viewing the electrode pad 304 after the inspection from right above is indicated by FIG. 6(k) and FIG. 6(l). Therefore, in the comparison of the above-mentioned step S5, when a protruding portion 304d exists on an edge portion 304b, the external shapes are determined as being different and as "good in the inspection". Moreover, even in the case when the external shapes are determined as the same and as "defective in the inspection", if a needle trace 105 shown in FIG. 6(k) is detected in step S6, it is determined as "good in the inspection", while if no needle trace 105 is detected, it is determined as "defective in the inspection".

Additionally, in the above-mentioned embodiment, explanations have been given by exemplifying the electrode pads 104, 204 and 304 shown in FIG. 4 to FIG. 6; however, with respect to electrode pads having shapes other than these, the detection can be carried out in the same manner.

Additionally, in the above-mentioned embodiment, explanations have been given by exemplifying cases where the shape of the electrode pad after the inspection and the shape of the electrode pad before the inspection are mutually compared with each other; however, the determination may be made not by comparing the shapes with each other, but by detecting a strain in the electrode pad based upon calculations executed on shape data. The following description will discuss the detection determination method by using the strain.

Figure 7:
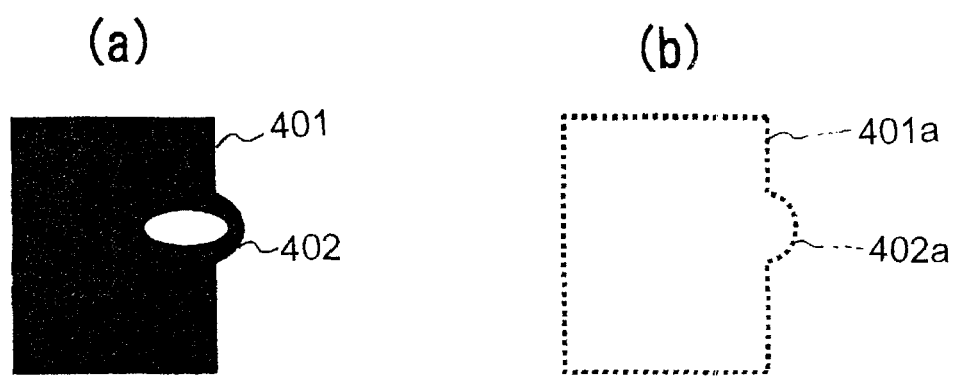
FIG. 7, which show views for explaining another method for determining the quality of the electrode pad having a rectangular shape in the inspection, include FIG. 7(a) that is a plan view of the electrode pad after the inspection.
Figure 8:
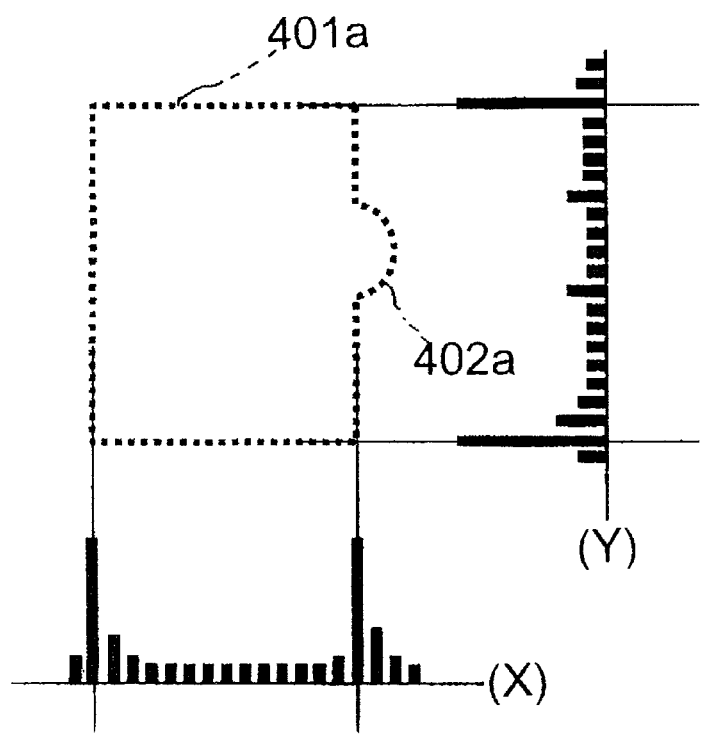
FIG. 8 is a view that explains image processing of the electrode pad shown in FIG. 7.
Figure 9:
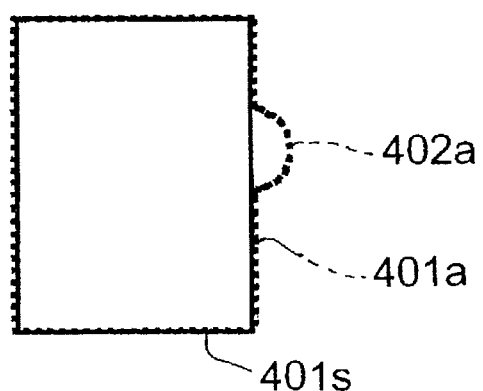
FIG. 9 is a view that explains the quality determination of the inspection of the electrode pad shown in FIG. 7.

FIGS. 7 to 9 show cases where a strain is determined on an electrode pad 401 having a rectangular shape. FIG. 7(a) indicates a shape of an electrode pad 401 after the inspection, and the electrode pad 401 on which the probe 102 has been pressed has a distorted portion (protruding portion) 402 in addition to the original shape, and a contour 401a detected after the inspection has a shape with a protruding portion 402a, as shown in FIG. 7(b). Moreover, when the contour 401a having the protruding portion 402a is represented as aggregated points by image processing, it is indicated by point sequences of coordinates $(X_n, Y_n)$ having N-numbered contours. On the other hand, with respect to the target electrode pad 401, a standard contour 401s corresponding to the position, the size, the shape and the like of the electrode pad before the probe 102 has been pressed thereon is preliminarily stored in a storage device (not shown) of the control unit 27.

In the case when the strain of the electrode pad 401 is detected, as shown in FIG. 8, upon counting the numbers of point sequences respectively in the lateral direction (X-axis direction) and the longitudinal direction (Y-axis direction), peaks appear on edge portions of a rectangular shape respectively in the lateral direction and the longitudinal direction. Based upon this fact, the positions of edges in the electrode pad 401 to be inspected, that is, the position of the electrode pad 401, can be predicted. Moreover, as shown in FIG. 9, the standard contour 401s having a rectangular shape indicated by a solid line of the electrode pad 401, which has been preliminarily stored in the storage device of the control unit 27, is fitted to the contour 401a of the target electrode pad 401, and by extracting a protruding point sequence (402a) from the rectangular standard contour 401s, it is possible to detect a strain of the target electrode pad 401. Therefore, based upon the presence or absence of this strain, the good or defective inspection result can be determined.

Figure 10:
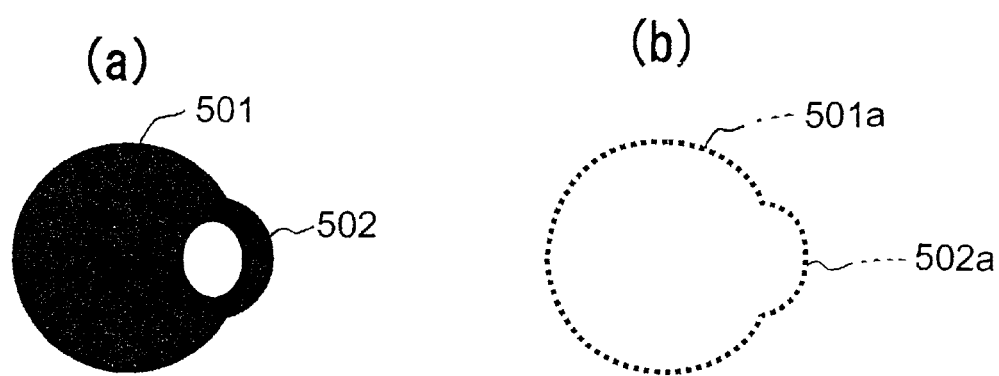
FIG. 10, which show views for explaining another method for determining the quality of the electrode pad having a round shape in the inspection, include FIG. 10(a) that is a plan view of the electrode pad after the inspection.
Figure 11:
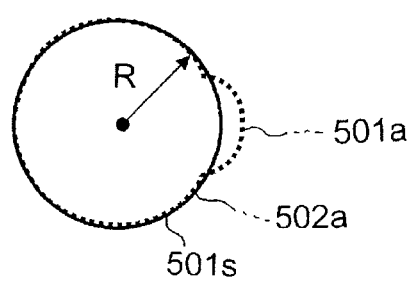
FIG. 11 is a view that explains the quality determination of the inspection of the electrode pad shown in FIG. 10.
Figure 12:
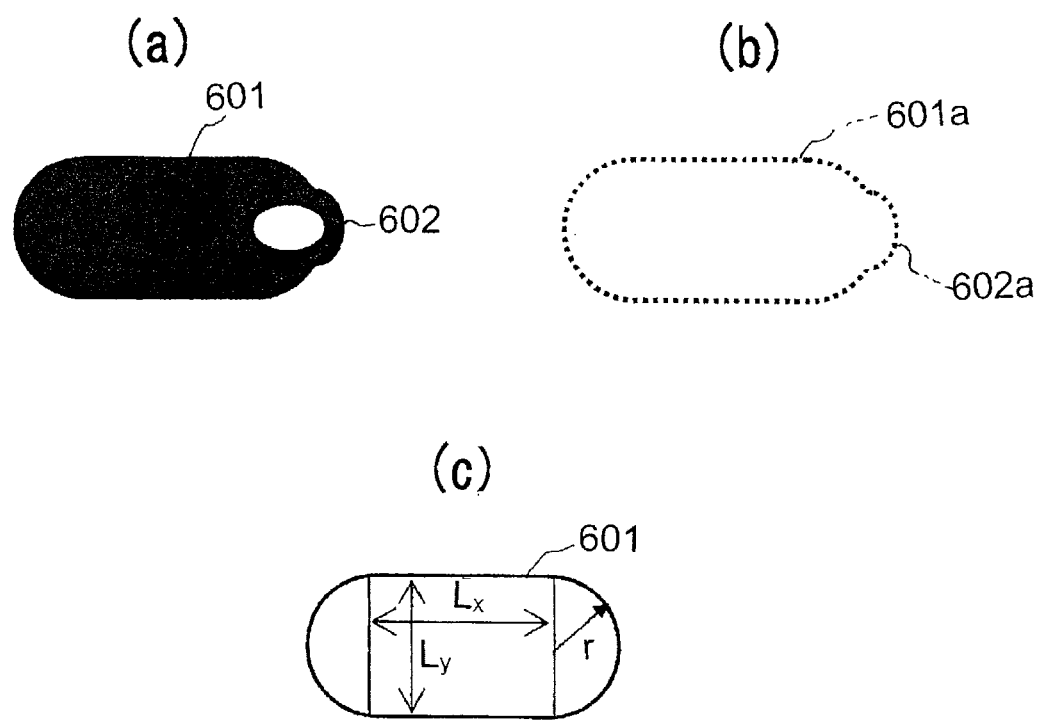
FIG. 12, which show views for explaining another method for determining the quality of the electrode pad having a horseshoe shape in the inspection, include FIG. 12(a) that is a plan view of the electrode pad after the inspection.

FIGS. 10 to 11 show cases where a strain is determined on an electrode pad 501 having a round shape. FIG. 10(a) indicates a shape of an electrode pad 501 after the inspection, and the electrode pad 501 on which the probe 102 has been pressed has a distorted portion (protruding portion) 502 in addition to the original shape, and a contour 501a detected after the inspection has a shape with a protruding portion 502a, as shown in FIG. 10(b). Moreover, when the contour 501a having the protruding portion 502a is represented as aggregated points by image processing, it is indicated by point sequences of coordinates (Xn, Yn) having N-numbered contours. On the other hand, with respect to the target electrode pad 501, a standard contour 501s corresponding to the position, the size, the shape and the like of the electrode pad before the probe 102 has been pressed thereon is preliminarily stored in a storage device (not shown) of the control unit 27.

In the case when the strain of the electrode pad 501 is detected, as shown in FIG. 11, circle approximation is performed by the method of least squares on point sequences of coordinates (Xn, Yn) represented by N-numbered contours so that the circular fitting with a radius R is obtained to form a reference contour 501s. Thus, in the same manner as in the case of the electrode pad 401 having a rectangular shape, by extracting a protruding point sequence (502a) from the reference contour 501s having a round shape, the strain of the target electrode pad 501 can be detected. Therefore, based upon the presence or absence of the strain, the quality of the inspection can be determined.

FIGS. 12 to 15 show cases where a strain is determined on an electrode pad 601 having a horseshoe shape. FIG. 12(a) indicates a shape of an electrode pad 601 after the inspection, and the electrode pad 601 on which the probe 102 has been pressed has a distorted portion (protruding portion) 602 in addition to the original shape, and a contour 601a detected after the inspection has a shape with a protruding portion 602a, as shown in FIG. 12(b). Moreover, as shown in FIG. 12(c), the horseshoe-shaped electrode pad 601 is represented by a lateral length Lx and a longitudinal length Ly. In this case, the lateral length Lx means a straight line section in the lateral direction. The radius r of circular arcs at the two ends is represented by (r=Ly/2) since the longitudinal length Ly forms the diameter, and found to be indicated by Lx and Ly. Additionally, in the case when the lengths of Ly and Lx are reversed to each other, it is represented by (r=Lx/2) in the same manner.

Moreover, in the same manner as in the rectangular shape, when the contour 601a is represented as aggregated points by image processing, it is indicated by point sequences of coordinates (Xn, Yn) having N-numbered contours. On the other hand, with respect to the target electrode pad 601, a standard contour 601s corresponding to the position, the size, the shape and the like of the electrode pad before the probe 102 has been pressed thereon is preliminarily stored in a storage device (not shown) of the control unit 27.

Figure 13:
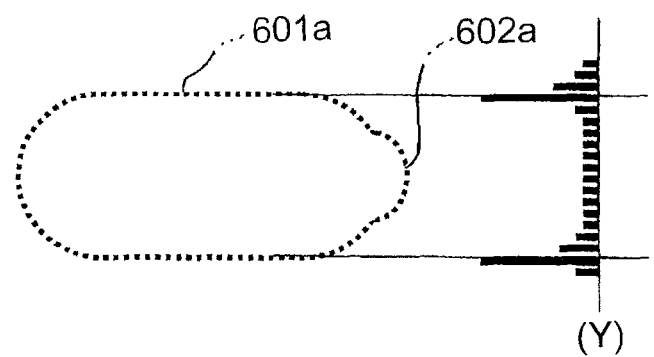
FIG. 13 is a view that explains image processing of the electrode pad shown in FIG. 12.
Figure 14:
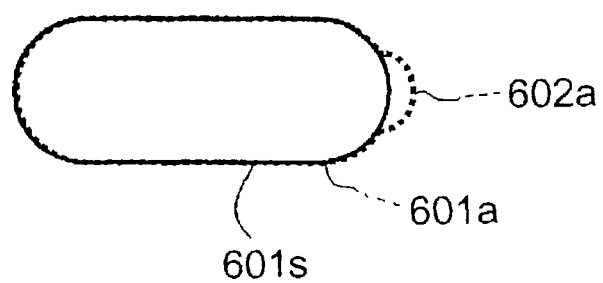
FIG. 14 is a view that explains the quality determination of the inspection of the electrode pad shown in FIG. 12.

In the case when the strain of the electrode pad 601 is detected, as shown in FIG. 13, upon performing projection onto the detected contour 601a in the longitudinal direction of a circumscribed rectangular shape surrounding the contour, a peak appears on an edge portion relative to the detected contour 601a in the same manner as in the case of the rectangular shape. With respect to the horseshoe-shaped electrode pad 601, since the radius r of the circular arcs on the two ends is found from the edge width, as shown in FIG. 14, a fitting process can be carried out on the semi-circle with the radius r forming a reference contour 601s by the least squares method or the like. Thus, in the same manner as in the case of the electrode pad 401 having a rectangular shape, by extracting a point sequence (602a) protruding from the reference contour 601s having a horseshoe shape, it is possible to detect the strain of the target electrode pad 601. Therefore, based upon the presence or absence of the strain, the quality of the inspection can be determined.

Moreover, in the present invention, various modifications may be made thereto without departing from the spirit of the invention, and it is needless to say that those modifications are included within the present invention.

INDUSTRIAL APPLICABILITY

The present invention has been discussed by exemplifying a probing device for carrying out an electrical inspection on a chip on a wafer, with an electrode pad being made in contact with a probe with a predetermined pressure; however, the present invention may be used for applications other than the inspection for a chip on a wafer.

What is claimed is:

1. A probing device for carrying out an electrical inspection of an electrode pad of an electronic device by contact with a probe with a predetermined pressure, comprising:
   a probe that contacts the electrode pad to form a protruding portion on the electrode pad;
   a microscope forming an image of the electrode pad comprising an upper viewing contour shape of the electrode pad; and
   a control unit that stores the image as initial image data of the upper viewing contour shape of the electrode pad prior to the contact with said probe, and compares the initial image data of the upper viewing contour shape of the electrode pad thus stored with subsequent image data of a subsequent contour shape after the contact with said probe and imaged by said microscope so that the protruding portion is detected, whereby contact between the electrode pad and the probe is capable of being determined.

2. A probing device for carrying out an electrical inspection of an electrode pad of an electronic device by contact with a probe with a predetermined pressure, comprising:
   a probe that contacts the electrode pad to form a protruding portion on the electrode pad;

a storage device storing an initial size and an initial upper viewing contour shape of the electrode pad; and a control unit that compares an outer peripheral contour of the electrode pad after contact with said probe with the initial size and the initial upper viewing contour shape so that the protruding portion is detected, whereby contact between the electrode pad and the probe is capable of being determined.

3. A probing method for carrying out an electrical inspection of an electrode pad of an electronic device on a substrate by contact with a probe with a predetermined pressure, comprising the steps of:

storing a first image of an initial contour shape of the electrode pad;

contacting the electrode pad with the probe forming a subsequent contour shape comprising a protruding portion;

storing a second image of the subsequent contour shape comprising the protruding portion;

comparing the first image of the initial contour shape of the electrode pad prior to the contact with the probe with the second image of the subsequent contour shape comprising the protruding portion after the contact with the probe, whereby contact between the electrode pad and the probe is determined.

4. A method of inspecting an electrode pad formed on a substrate comprising the steps of:

forming an electrode pad having an edge comprising an initial upper viewing outer periphery contour in a plane formed on a surface of a substrate;

contacting the electrode pad adjacent the edge of the initial outer periphery contour with a probe;

applying a force with the probe to the electrode pad adjacent the edge sufficient to form a protruding portion adjacent the edge forming a different outer periphery contour of the electrode pad in the plane formed on the surface of the substrate;

detecting the different outer periphery contour of the electrode pad in the plane formed on the surface of the substrate;

comparing the different outer periphery contour with the protruding portion of the electrode pad in the plane formed on the surface of the substrate with the initial upper viewing outer periphery contour in the plane formed on the surface of the substrate, whereby contact between the electrode pad and the probe is capable of being determined based on the formation of the protruding portion.

5. A probing device for carrying out an electrical inspection of an electrode pad of an electronic device formed on a substrate by contact with a probe with a predetermined pressure, comprising:

a microscope forming an image of the electrode pad comprising an initial contour shape of the electrode pad in a plane on a surface of the substrate;

a probe, said probe contacting the electrode pad with the predetermined pressure and causing a strain on the electrode pad creating a change in contour shape in a plane on the surface of the substrate; and a control unit that stores the image as image data of the initial contour shape of the electrode pad prior to the contact with said probe, and compares the image data of the initial contour shape of the electrode pad with subsequent image data of the change in contour shape after the contact with said probe and imaged by said microscope so that the change in contour shape in a plane on the surface of the substrate is detected, whereby contact between the electrode pad and said probe is capable of being determined.

6. The probing device according to claim 5, wherein:

the change in contour comprises a protruding portion extending beyond a portion of the initial contour shape of the electrode pad.

7. A probing device for carrying out an electrical inspection of an electrode pad of an electronic device formed on a substrate by contact with a probe with a predetermined pressure, comprising:

means for preliminarily specifying a size and an initial contour shape of the electrode pad in a plane on a surface of the substrate;

a probe, said probe contacting the electrode pad with the predetermined pressure and causing a strain on the electrode pad creating a change in contour shape comprising a protruding portion extending beyond a portion of the initial contour shape of the electrode pad in the plane on the surface of the substrate;

means for forming an image of the change in contour shape comprising the protruding portion of the electrode pad; and a control unit that compares an outer peripheral contour with the image of the change in contour shape of the electrode pad after contact with the probe with the initial contour shape so that the change in contour shape comprising the protruding portion of the electrode pad in the plane on the surface of the substrate is detected, whereby the contact between the electrode pad and the probe is capable of being determined.

* * * * *